(12) United States Patent
Chen et al.

(10) Patent No.: US 10,754,232 B2
(45) Date of Patent: Aug. 25, 2020

(54) OPTICAL PROJECTOR MODULE

(71) Applicants: TRIPLE WIN TECHNOLOGY(SHENZHEN) CO.LTD., Shenzhen (CN); HON HAI PRECISION INDUSTRY CO., LTD., New Taipei (TW)

(72) Inventors: Shin-Wen Chen, New Taipei (TW); Jing-Wei Li, Guangdong (CN); Sheng-Jie Ding, Guangdong (CN); Jian-Chao Song, Guangdong (CN)

(73) Assignee: TRIPLE WIN TECHNOLOGY (SHENZHEN) CO. LTD., Shenzhen (CN)

(*) Notice: Subject to any disclaimer, the term of this patent is extended or adjusted under 35 U.S.C. 154(b) by 33 days.

(21) Appl. No.: 16/158,115

(22) Filed: Oct. 11, 2018

(65) Prior Publication Data
US 2019/0384145 A1    Dec. 19, 2019

(30) Foreign Application Priority Data

Jun. 13, 2018    (CN) .......................... 2018 1 0604785

(51) Int. Cl.
| | |
|---|---|
| G03B 21/16 | (2006.01) |
| G02B 27/30 | (2006.01) |
| G03B 21/20 | (2006.01) |
| H05K 1/02 | (2006.01) |
| G02B 27/09 | (2006.01) |

(52) U.S. Cl.
CPC ......... *G03B 21/16* (2013.01); *G02B 27/0955* (2013.01); *G02B 27/30* (2013.01); *G03B 21/2033* (2013.01); *H05K 1/0274* (2013.01)

(58) Field of Classification Search
CPC  G03B 21/16; G03B 21/2033; G02B 27/0955; G02B 27/30; H05K 1/0274
See application file for complete search history.

(56) References Cited

U.S. PATENT DOCUMENTS

| | | | | |
|---|---|---|---|---|
| 2001/0007527 A1* | 7/2001 | Lammers | ................ | F21S 6/002 362/294 |
| 2011/0304762 A1 | 12/2011 | Chiu | | |
| 2012/0120375 A1* | 5/2012 | Kilcher | .................. | G01S 17/42 353/98 |
| 2019/0265497 A1* | 8/2019 | Bai | ...................... | G03B 21/208 |

FOREIGN PATENT DOCUMENTS

| | | | | |
|---|---|---|---|---|
| CN | 106443943 A1 * | 12/2016 | .......... | G02B 6/4281 |
| CN | 106443913 | 4/2018 | | |
| TW | 201144888 | 12/2011 | | |

OTHER PUBLICATIONS

MachineTranslationof106443943A1 (Year: 2020).*

* cited by examiner

*Primary Examiner* — Jerry L Brooks
(74) *Attorney, Agent, or Firm* — ScienBiziP, P.C.

(57) ABSTRACT

An optical projector module proofed against distortion caused by heat building up in and around the light-emitting element includes a printed circuit board (PCB), a light emitting element, and an optical structure. The optical structure on the PCB includes a supporting member almost completely enclosing the light emitting element. The supporting member includes an embedded metal heat dissipating layer extending to cover outside surfaces of the supporting member. The metal heat dissipating layer occupies more than 70% of the outside surfaces of the supporting member, and being metallic the dissipating layer is able to conduct electricity.

19 Claims, 5 Drawing Sheets

OPTICAL PROJECTOR MODULE

FIELD

The subject matter herein generally relates to optical projectors.

BACKGROUND

An optical projector module includes a printed circuit board and a light emitting element mounted on the printed circuit board. The light emitting element can generate great amounts of heat, which can lead to the light beam emitted there from being distorted.

Therefore, there is room for improvement within the art.

BRIEF DESCRIPTION OF THE DRAWINGS

Implementations of the present technology will now be described, by way of example only, with reference to the attached figures.

DETAILED DESCRIPTION

Figure 1:
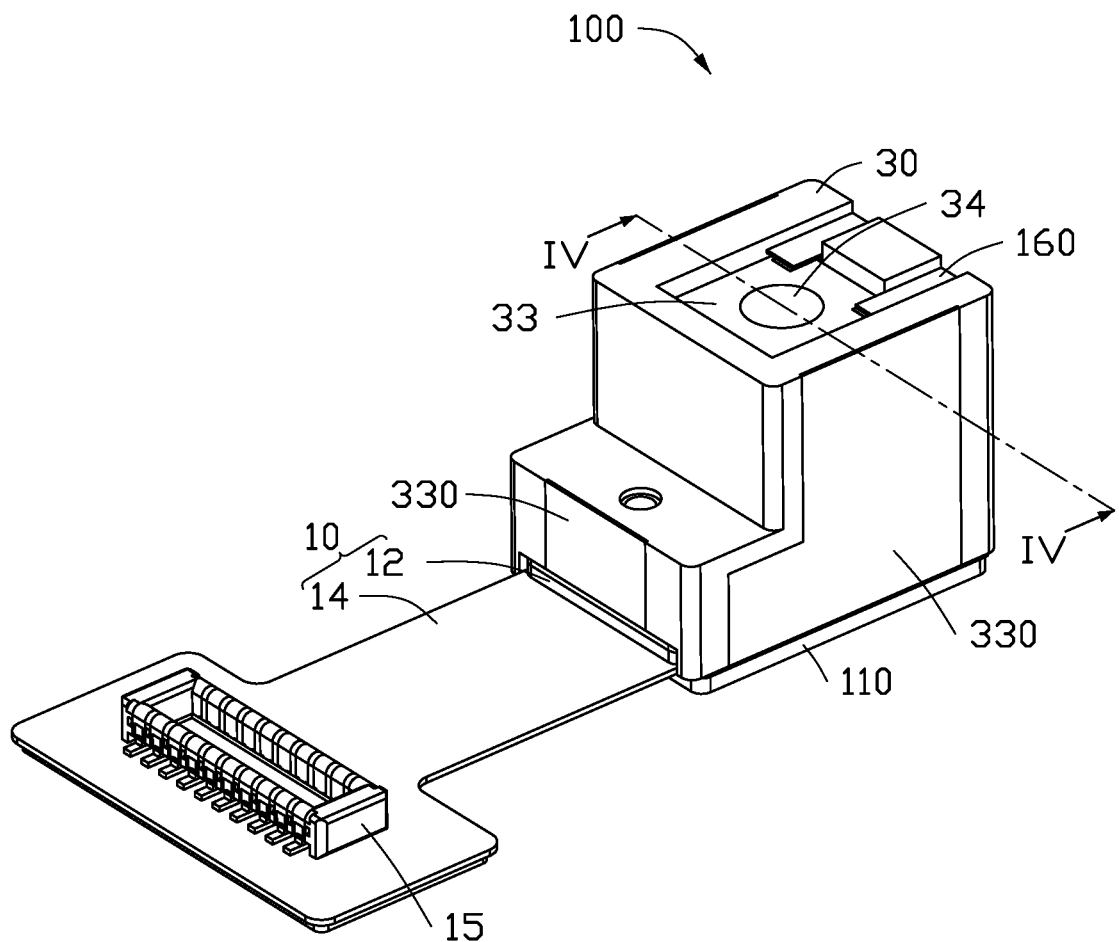
FIG. 1 is an isometric view of an optical projector module in accordance with one embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better. The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

Figure 2:
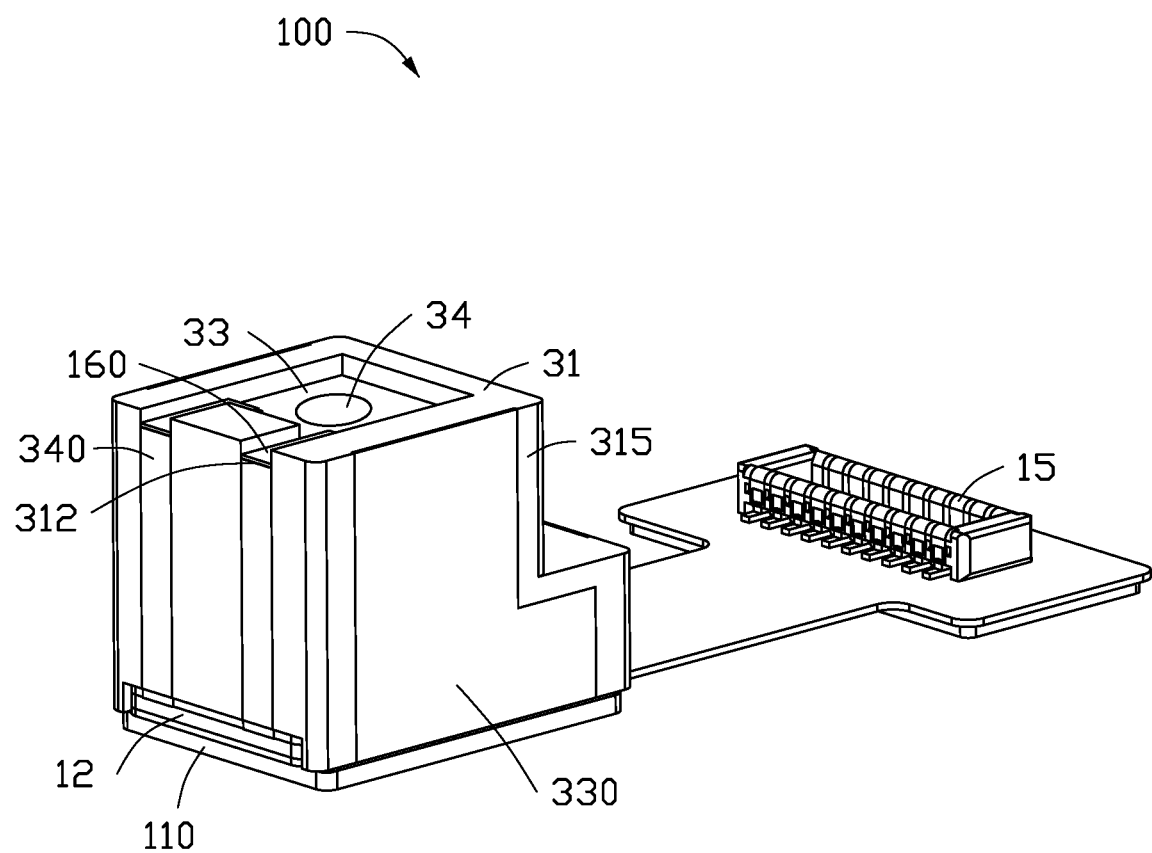
FIG. 2 is another isometric view of the optical projector module in FIG. 1.
Figure 3:
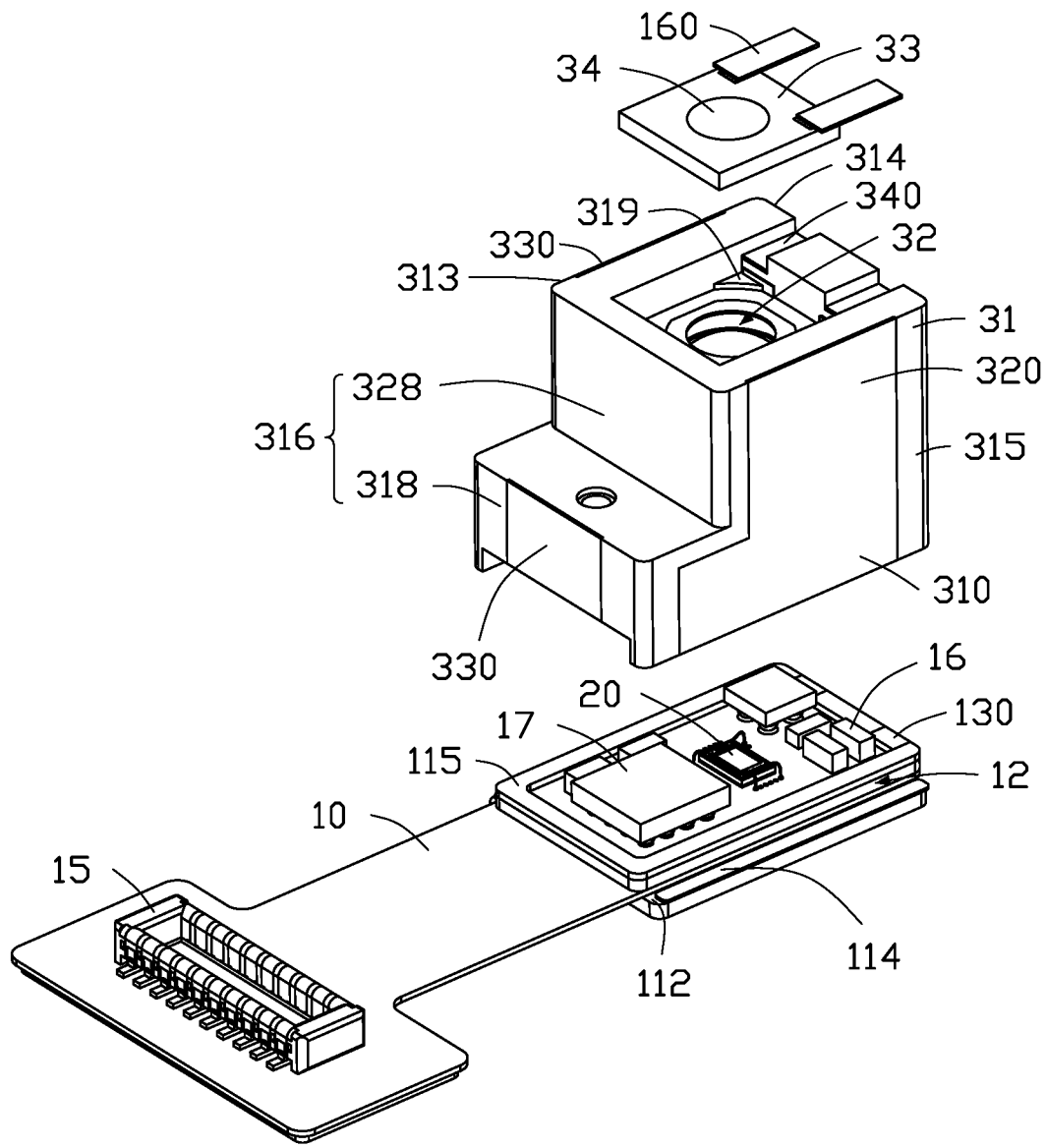
FIG. 3 is an exploded isometric view of the optical projector module in FIG.

FIG. 1-3 illustrate an optical projector module 100 according to one embodiment. The optical projector module 100 includes a printed circuit board 10, a light emitting element 20 mounted on the printed circuit board 10, and an optical structure 30 mounted on the printed circuit board 10 and almost completely enclosing the light emitting element 20.

The printed circuit board 10 can be a flexible circuit board or a rigid-flexible board. In the illustrated embodiment, the printed circuit board 10 is a ceramic board. A strengthening board 110 can be formed on bottom of the printed circuit board 10. The strengthening board 110 is made of metal and configured to dissipate heat from the printed circuit board 10. A size of the printed circuit board 10 is smaller than a size of the strengthening board 110. Lengthwise, the sides of the strengthening board 110 are exposed outside the printed circuit board 10, that is, the two sides of the printed circuit board 10 and the strengthening board 110 together form two step portions 112. Each step portion 112 is formed with a layer of thermal conductivity gel 114, as shown in FIG. 3.

The printed circuit board 10 includes a main portion 12 and an extending portion 14 connecting to the main portion 12, as shown in FIG. 2. The main portion 12 is configured to mount the light emitting element 20 and the optical structure 30 thereto. The extending portion 14 is configured to mount a connector 15. The connector 15 is electrically connected to the light emitting element 20.

The printed circuit board 10 further includes components 16 mounted around the light emitting element 20. The several components 16 include resistors, capacitors, and inductors.

The printed circuit board 10 further includes a monitoring control unit 17 mounted beside the light emitting element 20. The monitoring control unit 17 is electrically connected to the light emitting element 20 to detect an optical power of the light emitting element 20, and feed the detected optical power to the printed circuit board 10 for adjusting optical power of the light emitting element 20.

The light emitting element 20 is mounted on the main portion 12. The light emitting element 20 is selected from VCSEL (Vertical Portion Surface Emitting Laser), light emitting diodes (LEDs), infra-red (IR) LEDs, organic LEDs (OLEDs), infra-red (IR) lasers), etc. In this embodiment, the light emitting element 20 is VCSEL array and able to emit light with wave lengths ranging 830 nm to 950 nm.

Figure 4:
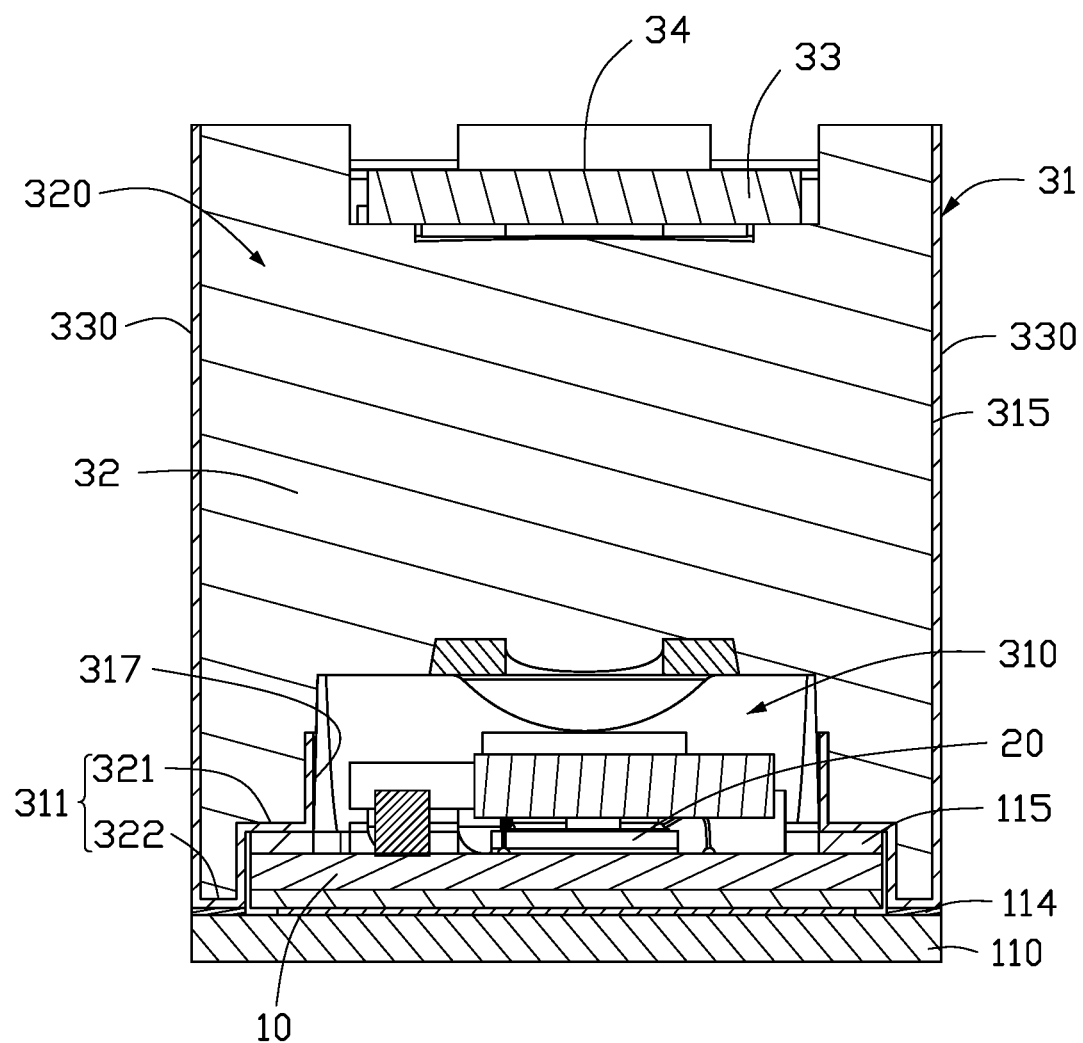
FIG. 4 is a cross-sectional view of the optical projector module in FIG. 1.

The optical structure 30 is mounted on the main portion 12 and covers the light emitting element 20, as shown in FIG. 4. The optical structure 30 in this embodiment includes a supporting member 31, a collimating lens 32, a diffraction optical lens 33, and a transparent conducting film 34, as shown in FIG. 2.

The supporting member 31 is fixed on the printed circuit board 10 by adhesive and covers the light emitting element 20. In the embodiment, the supporting member 31 is fixed on the main portion 12 of the printed circuit board 10 by a thermal conductivity gel 115 on the printed circuit board 10 and a thermal conductivity gel 114 on the strengthening board 110.

In the shown embodiment, the supporting member 31 includes a lower receiving portion 310 and a top receiving portion 320 extending from the lower receiving portion 310. The lower receiving portion 310 and the top receiving portion 320 are square structures. The lower receiving portion 310 is larger than the top receiving portion 320. The top receiving portion 320 communicates with the lower receiving portion 310 by a through hole. The lower receiving portion 310 covers the light emitting element 20.

At least one collimating lens 32 is received in the top receiving portion 320 and can collimate light rays from the light emitting element 20.

One or more diffraction optical lens 33 is arranged in a light path of the collimating lens 32. The supporting member 31 includes several supporting plates 319 formed on corners of the top receiving portion 320, and the diffraction optical lens 33 is disposed on the supporting plates 319. Each collimating lens 32 can receive light rays from the collimating lens 32 and emit the received light in patterns.

The transparent conducting film 34 is on at least one surface of the diffractive optical element 33. The transparent conducting film 34 is formed on a surface of each diffractive optical element 33 away from the collimating lens 32. The transparent conducting film 34 is indium tin oxide (ITO). The transparent conducting film 34 may be electroplated on the diffractive optical element 33 or bonded on the diffractive optical element 33 by a colloid adhesive.

The transparent conducting film 34 is electrically connected to the printed circuit board 10. The transparent conducting film 34 detects the optical power of the infrared light emitted from the light emitting element 20 and transmits the detected powers to the monitoring control unit 17 on the printed circuit board 10. The monitoring control unit 17 compares the detected optical power with a normal value. When power of the light beam emitted by the light emitting element 20 exceeds a predetermined value, electrical resistance of the conducting film 34 is changed, and the value of the change in resistance is transmitted to the monitoring control unit 17. The monitoring control unit 17 can adjust amount of power or shut off power supplied to the light emitting element 20.

Particularly, the supporting member 31 defines a heat dissipating region 301 and a conducting region 303. The heat dissipating region 301 and the conducting region 303 may be located on the same outer surfaces of the supporting member 31 or on different outer surfaces of the supporting member 31. The heat dissipating region 301 and the conducting region 303 are located on different outer surfaces of the supporting member 31. The heat dissipating region 301 includes a metal heat dissipating layer 330 embedded on the surface of the supporting member 31. Heat generated by the light emitting element 20 is transmitted outside of the supporting member 31 through the metal heat dissipating layer 330.

The conducting region 303 includes at least one conducting circuit 340 embedded on at least one outside surface of the supporting member 31. The conducting circuit 340 is electrically connected to the printed circuit board 10, and material of the metal heat dissipating layer 330 is the same material as the conducting circuit 340. That is, the metal heat dissipating layer 330 and the conducting circuits 340 are thermally and electrically conducting. The conducting circuit 340 and the metal heat dissipating layer 330 are formed using a laser direct structuring (LDS) method or an insert molding method.

The supporting member 31 includes a first outside surface 313, a second outside surface 314, a third outside surface 315, and a fourth outside surface 316. The first outside surface 313 is opposite to the third outside surface 315, and both the first outside surface 313 and the third outside surface are L-shaped. The fourth outside surface 316 includes a top connecting surface 328 and a lower connecting surface 318 parallel to the top side surface 328. The top connecting surface 328 is one portion of the top receiving portion 320, and the lower connecting surface 318 is one portion of the lower receiving portion 310. The conducting region 303 includes two conducting circuits 340, and the two conducting circuits 340 are formed on the second outside surface 314. The two conducting circuits 340 extend in a straight line to the top end 312 of the supporting member 31, as shown in FIG. 2.

The heat dissipating region 301 includes three metal heat dissipating layers 330. Each outside surface is formed with one metal heat dissipating layer 330. Each metal dissipating layer 330 is substantially U-shaped, as shown in FIG. 4. That is, each metal heat dissipating layer 330 extends from inner surface 317 of the lower receiving portion 310 to outside surfaces of the supporting member 31. The metal heat dissipating member 350 is substantially L-shaped on the first outer surfaces 313 and the third outer surfaces 315 but is rectangular on the lower connecting surface 318. The metal heat dissipating layers 330 occupy more than 70% of an area of the outside surface of the supporting member 31.

The bottom 311 is stepped, as shown in FIG. 4, and capable for optimizing heat dissipating. The bottom 311 includes a first bottom portion 321 and a second bottom portion 322. The metal heat dissipating layer 330 on the first bottom portion 321 makes contact with the thermal conducting silica gel 114 on the step portion 112. The metal heat dissipating layer 330 on the second bottom portion 322 makes contact with the thermal conducting silica gel 114 on the surface of the strengthening board 110. The thermal conducting silica gel 114 fixes the supporting member 31, and also dissipates heat.

The printed circuit board 10 is provided with two first conducting portions 130 corresponding to the conducting circuit 340, as shown in FIG. 3. The transparent conducting film 34 is formed with two second conducting portions 160 corresponding to the conducting circuit 340. The first conducting portion 130 and the second conducting portion 160 are conducting adhesive or conducting pads. Opposite ends of each conducting circuit 340 are electrically connected to the first conducting portion 130 and the second conducting portion 160. Thereby, the transparent conducting film 34 is electrically connected to the printed circuit board 10 by the conducting circuit 340 and the first conducting portion 130.

Heat generated by the light emitting element 20 is first transferred to the metal heat dissipating layer 330 on the inner surface 317, and then the heat is transferred to the outside surface 315 by the metal heat dissipating layer 330 on the bottom 311. This avoids heat accumulation in the lower receiving portion 310. Any shift in position of the collimating lens 32 caused by thermal deformation due to the large amount of heat of the optical projector 100 is avoided. Therefore, distortion caused by the heat of the light emitting element 20 is avoided. The metal heat dissipating layer 330 covers most parts of the outside surfaces 315, the strength of the supporting member 31 can be thereby increased and reliability enhanced.

Figure 5:
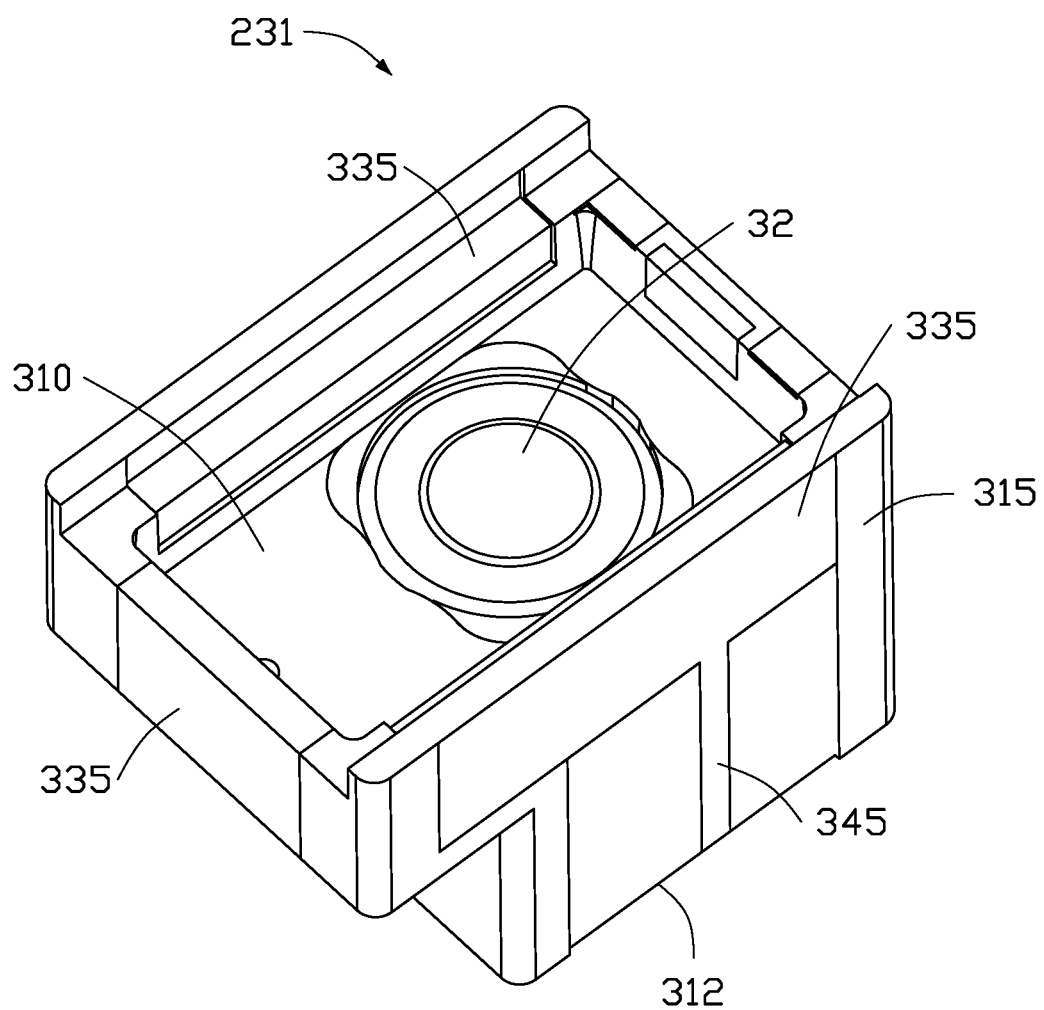
FIG. 5 is an isometric view of a supporting member of the optical projector module of FIG. 1 in accordance with one embodiment.

FIG. 5 shows a supporting member 231 according to another embodiment. The supporting member 231 in FIG. 5 is similar to the supporting member 31 in FIG. 3. The difference between the supporting member 231 and the supporting member 31 in FIG. 3 is that the conducting circuit 345 and the metal heat dissipating layer 335 are formed on a same outside surface. In the another embodiment, the conducting circuit 345 and the metal heat dissipating layer 335 are formed on the first outside surface 313 and the third outside surface 315.

The metal heat dissipating layer 335 is formed on an outside surface of the lower receiving portion 310, and the conducting circuit 345 is connected to the metal heat dissipating layer 335 on the outer surface of the top receiving portion 320. The conducting circuit 345 extends to the top end 111 of the supporting member 31. A width of the conducting circuit 345 is far less than a width of the metal heat dissipating layer 345. The metal heat dissipating layer 335 conducts electricity as well as heat, thereby the printed circuit board 10 is electrically connected to the conducting film 34 by the first conducting portions 130, the metal heat dissipating layer 335, the conducting circuit 345, and the second conducting portions 160.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. An optical projector module comprising:
a printed circuit board;
a light emitting element mounted on the printed circuit board; and
an optical structure mounted on the printed circuit board, wherein the optical structure comprises:
a supporting member, the supporting member shades the light emitting element and defines a heat dissipating region;
the heat dissipating region comprises a metal heat dissipating layer embedded inside an inner surface of the supporting member and extending to cover an outside surface of the supporting member, the metal heat dissipating layer occupies more than 70% of an area of the outside surface of the supporting member; and
a material of the dissipating layer is metal and able to conduct electricity; and wherein the supporting member further comprises at least one conducting circuit embedded on one outside surface of the supporting member, and the at least one conducting circuit is electrically connected to the printed circuit board by the metal heat dissipating layer or directly extends to a bottom end of the supporting member to be electrically connected to the printed circuit board.

2. The optical projector module of claim 1, wherein the printed circuit board is a flexible circuit board or a rigid-flexible board, the printed circuit board comprises a main portion and an extending portion connecting with the main portion, the light emitting element and the optical structure are mounted on the main portion.

3. The optical projector module of claim 1, wherein the light emitting element is selected from vertical portion surface emitting laser, light emitting diodes, infra-red LEDs, organic LEDs or infra-red lasers.

4. The optical projector module of claim 1, wherein:
the supporting member comprises a lower receiving portion and a top receiving portion extending from the lower receiving portion;
the lower receiving portion and the top receiving portion are square shaped structures;
the lower receiving portion is larger than the top receiving portion; and
the lower receiving portion covers the light emitting element.

5. The optical projector module of claim 4, wherein:
the optical structure further comprises a collimating lens; and a diffraction optical lens;
the collimating lens is received on the top receiving portion and configured to collimate light rays emitting from the light emitting element, and
the diffraction optical lens is arranged in a light path of the collimating lens.

6. The optical projector module of claim 5, wherein:
the optical structure further comprises a transparent conducting film;
the transparent conducting film is formed at least one surface of the diffractive optical element; and
the transparent conducting film is electrically connected to the printed circuit board.

7. The optical projector module of claim 6, wherein the transparent conducting film is formed on a surface of the diffractive optical element away from the collimating lens.

8. The optical projector module of claim 7, wherein the printed circuit board further comprises a monitoring control unit mounted on the printed circuit board, the monitoring control unit is electrically connected to the light emitting element and configured to detect an optical power of the light emitting element, fed the result to the printed circuit board and adjust the optical power of the light emitting element.

9. The optical projector module of claim 8, wherein the printed circuit board further comprises a connector mounted on an extending portion of the printed circuit board, the connector transfers signal of the optical projector module to an external electrical device.

10. The optical projector module of claim 9, wherein the supporting member further comprises a conducting region, the conducting region and the heat dissipating region may be located on same outer surfaces of the supporting member or on different outer surfaces of the supporting member, the conducting region comprises the at least one conducting circuit, and a material of the conducting circuit is same material as that of the metal heat dissipating layer.

11. The optical projector module of claim 10, wherein the optical structure is fixed on a main portion of the printed circuit board by thermal conducting silica gel.

12. The optical projector module of claim 11, wherein the printed circuit board is provided with two first conducting portions, the transparent conducting film is formed with two second conducting portions, the conducting circuit electrically connected to the conducting film by the first conducting portion and the second conducting portion.

13. The optical projector module of claim 12, wherein the printed circuit board further comprises a strengthening board formed on the bottom of the main portion.

14. An optical projector module comprising:
a printed circuit board;
a light emitting element mounted on the printed circuit board; and
an optical structure mounted on the printed circuit board, wherein the optical structure comprises:

a supporting member, a collimating lens, a diffraction optical lens and a transparent conducting film, the supporting member shades the light emitting element, the collimating lens and the diffraction optical lens are received in the supporting member, the transparent conducting film is formed on at least one surface of the diffractive optical element, wherein the supporting member defines a conducting region and a heat dissipating region, the conducting region comprises at least one conducting circuit embedded on at least one outside surface of the supporting member, the heat dissipating region comprises a metal heat dissipating layer embedded on an inner surface of the supporting member, one end of the at least one conducting circuit is electrically connected to the printed circuit board by the metal heat dissipating layer or directly extends to a bottom end of the supporting member to be electrically connected to the printed circuit board, and the other end of the at least one conducting circuit is electrically connected to the transparent conducting film.

15. The optical projector module of claim 14, wherein the transparent conducting film is formed on a surface of the diffractive optical element away from the collimating lens.

16. The optical projector module of claim 15, wherein the printed circuit board further comprises a monitoring control unit mounted on the printed circuit board, the monitoring control unit is electrically connected to the light emitting element and configured to detect an optical power of the light emitting element, fed the result to the printed circuit board and adjust the optical power of the light emitting element.

17. The optical projector module of claim 1, wherein the at least one conducting circuit comprises two conducting circuits, the two conducting circuits are formed on same outer surface of the supporting member and are parallel to each other.

18. The optical projector module of claim 4, wherein the at least one conducting circuit comprises two conducting circuits, the two conducting circuits are respectively formed on opposite outer surfaces of the supporting member.

19. The optical projector module of claim 18, wherein the metal heat dissipating layer is formed on the lower receiving portion, and one of the conducting circuits is connected to the metal heat dissipating layer and extends to a top end of the supporting member, a width of the conducting circuit is significantly less than a width of the metal heat dissipating layer.

* * * * *